United States Patent [19]

Mullen et al.

[11] Patent Number: 5,446,683
[45] Date of Patent: Aug. 29, 1995

[54] METHODS AND APPARATUS FOR GENERATING PSEUDO-RANDOM BINARY PATTERNS

[75] Inventors: Sean F. Mullen; Jonathan Jebwab, both of Bristol, England

[73] Assignee: Hewlett-Packard Company, Palo Alto, Calif.

[21] Appl. No.: 221,354

[22] Filed: Mar. 31, 1994

[30] Foreign Application Priority Data

Apr. 6, 1993 [EP] European Pat. Off. ............ 93302681

[51] Int. Cl.[6] ............................................. G06F 1/02
[52] U.S. Cl. .................................................... 364/717
[58] Field of Search .......................... 364/717; 331/78; 380/46

[56] References Cited

U.S. PATENT DOCUMENTS

| 4,536,881 | 8/1985 | Kasuya . | |
|---|---|---|---|
| 4,734,921 | 3/1988 | Giangano . | |
| 5,111,416 | 5/1992 | Harada | 364/717 |
| 5,268,949 | 12/1993 | Watanabe et al. | 364/717 |

FOREIGN PATENT DOCUMENTS

| 0438322 | 7/1991 | European Pat. Off. . |
| 1248030 | 7/1986 | U.S.S.R. . |
| 8804097 | 6/1988 | WIPO . |

OTHER PUBLICATIONS

*Design Considerations for Parallel Pseudorandom Pattern Generators*, by Paul H. Bardell, Journal of Electronic Testing: Theory and Applications, 1, 73–87 (1990).
*Theory and Practice of Error Control Codes*, by R. E. Blahut, Addison–Wesley, Massachusetts, USA, 1983, pp. 176–183.
*Shift Register Sequences*, by Solomon W. Golomb, Aegean Park Press, California, USA, 1982, pp. 78–79.
"*concatenable Polydividers*": Bit–Sliced LFSR Chips for Board Self–test, by Dilip K. Bhavsar, 1985 International Test Conference, Philadelphia, USA, pp. 88–93.

Primary Examiner—Tan V. Mai

[57] ABSTRACT

Method and apparatus for generating a pseudo-random binary pattern having a variable characteristic polynomial. The pseudo-random binary pattern is formed as a plurality of serial bit streams, with corresponding bits in each stream forming together one of successive w-bit words in the binary pattern. A plurality of linear feedback shift register (LFSR) sequence generators are each arranged to generate bits for respective ones of the serial bit streams. Each LFSR generator includes a plurality of stages, the stages having an input stage, at least one intermediate stage, and an output stage, the stages being coupled for sequential propagation of signals through the stages. At least one of the stages in each LFSR generator is responsive to a respective control signal for that stage to determine whether signal propagation through that stage is influenced by a feedback signal for that LFSR generator. A portion of predetermined length of one of the serial bit streams is produced in accordance with the variable characteristic polynomial. The control signal is derived from that portion.

16 Claims, 5 Drawing Sheets

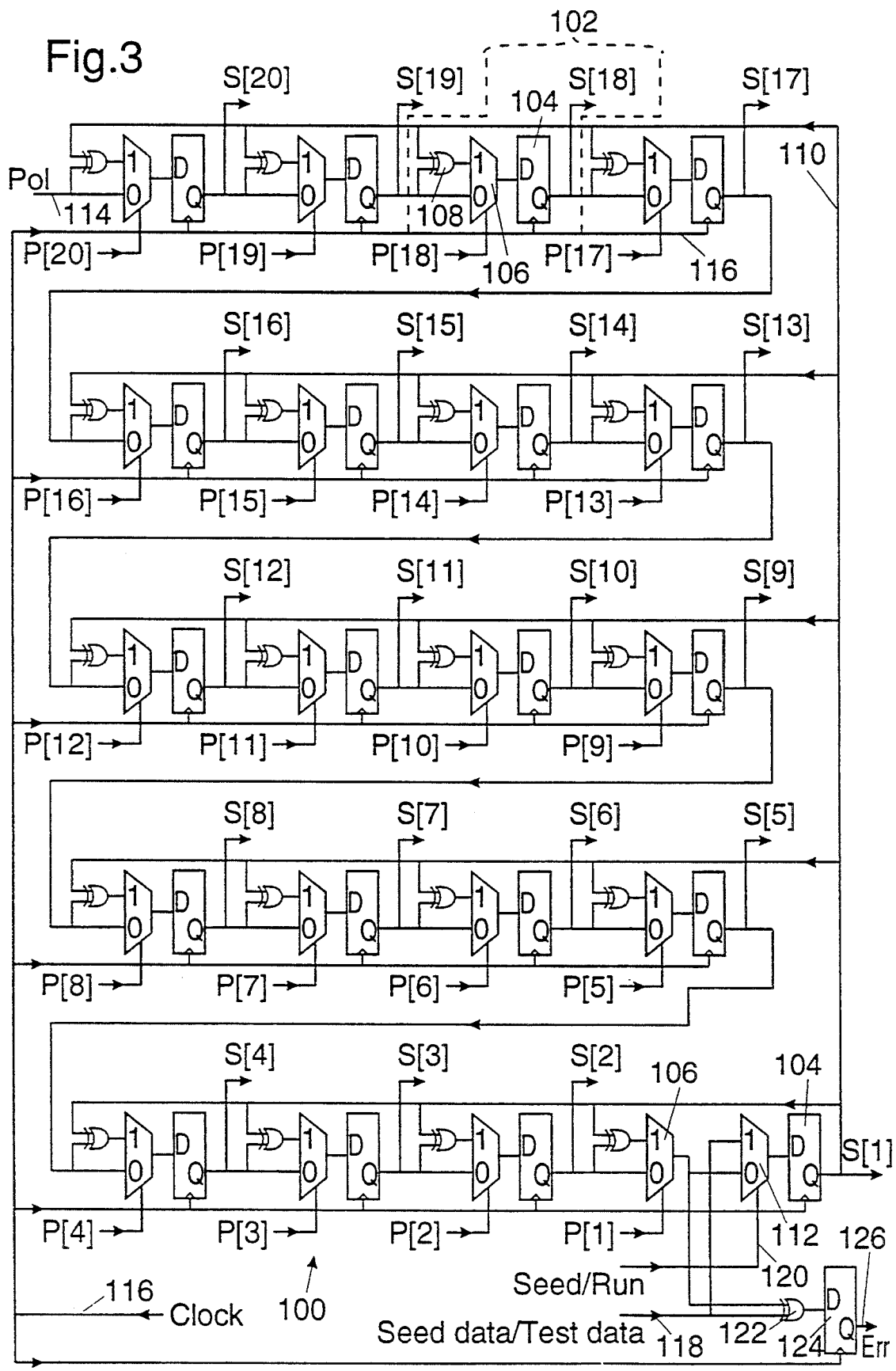

METHODS AND APPARATUS FOR GENERATING PSEUDO-RANDOM BINARY PATTERNS

TECHNICAL FIELD

This invention relates to methods and apparatus for generating pseudo-random binary patterns, and to bit error rate testing using such methods and apparatus.

BACKGROUND ART

An important parameter for assessing the quality of a binary digital communications link is its bit error rate (BER), that is the probability that a bit is incorrectly detected by a receiver. The BER is typically measured by transmitting over the link a long test sequence of bits, in principle selected at random, and counting how many are incorrectly received. A convenient method of both generating a test sequence and checking for correct reception is to use a pseudo-random binary sequence (PRBS).

A PRBS can be generated using a linear feedback shift register, as shown in FIG. 1. The output signal of the shift register is summed, modulo 2, with the outputs of selected intermediate stages of the register (e.g. using exclusive-OR gates), and the resulting signal is fed back to the input of the shift register. Appropriate selection of the stages whose outputs are combined by the exclusive-OR gates enables an n-stage shift register to generate a maximal length sequence with a period of $2^n 1$ bits, i.e. a PRBS. For example the feedback arrangement shown in FIG. 1 enables an 8-stage shift register to produce a maximal length sequence containing 255 bits. Since such a sequence is pseudo-random, it provides an effective test for exercising a communications link with a wide variety of bit patterns; nonetheless, the sequence is in fact fully deterministic, so it can be readily generated independently at the receiving end of the link to enable comparison of the sequence as received with an error-free reference version.

In the course of generating the PRBS the contents of the shift register will have as many different states (defined by the combination of the values in each of the shift-register stages) as there are bits in the maximal length sequence. Generation of the maximal length sequence can be commenced from any bit position in the sequence by initializing ('seeding') the shift register with the set of values for its stages corresponding to that bit position.

The identity of the shift-register stages which provide feed-back to the input can be characterized by means of a polynomial expression with a coefficient of unity for each term corresponding to a stage which provides feedback. Thus the characteristic polynomial for the PRBS generator of FIG. 1 is:

$$x^8 + x^6 + x^5 + x^4 + 1 \tag{1}$$

The shift register arrangement shown in FIG. 1 generates a PRBS as a single serial bit-stream at its output. Techniques are also known, using multiple circuits like that in FIG. 1, for generating a PRBS in such a manner that a plurality of successive bits (i.e. a word) of the PRBS are available simultaneously, or in parallel. Thus, referring to FIG. 2, a PRBS can be considered to comprise successive words each of length w (w=8 in the Figure). If these words are written so that corresponding bits are aligned as in the table in FIG. 2, the sequence of bits in each column A to H (e.g. the sequence 01100000 ... in column A) constitutes a decimation of the overall PRBS, with a decimation interval equal to the word length w. A set of linear feedback shift registers can be arranged with appropriate feedbacks (i.e. characteristic polynomial, which will be the same for each shift register) and initializing values so that they synchronously produce respective ones of the sequences in columns A to H. The outputs of these generators taken in parallel will then provide the overall PRBS a word at a time.

If w is a power of 2, the characteristic polynomial of each decimated sequence is the same as that for the overall PRBS. In addition, if the interval w has no common prime factors with the period of the overall PRBS, each decimated sequence is itself a PRBS of the same period, and the decimation is known as a proper decimation; otherwise the decimation is an improper decimation.

Hereinafter a sequence (maximal-length or not) of the kind that can be generated by the use of a linear feedback shift register is referred to as an LFSR sequence, irrespective of whether a conventional linear feedback shift register is actually used in the generation of the sequence. An arrangement which produces an LFSR sequence a word at a time is referred to herein as a pseudo-random pattern generator (PRPG). For convenience the following description will refer to a PRPG that is to be used for generating a PRBS.

PRPG's have a variety of uses. Thus, for example, the multi-bit PRPG output may be multiplexed into a single, serial PRBS having a bit rate higher than that of any of the individual sequence generators. Alternatively, a PRPG may be used for simultaneous testing of channels of a multi-bit (parallel) communications link.

As communications technology advances, it is generally necessary to provide PRPG's which operate faster and/or provide a PRBS having a longer period. In the past this has typically been accomplished by redesigning the sequence generators and/or increasing their number. The latter change itself can require a redesign of the sequence generators: if the bit rate of the multiplexed output of a PRPG for generating a given PRBS is increased by providing more sequence generators, the feedback connections for the sequence generators and the initializing values will in general need to be changed.

It is already known to provide a PRBS generator with a controllable number of stages and feedback arrangement. Thus, for example, SU 1 248 030 describes an arrangement in which a linear feedback shift register has each of its stages coupled via a multi-pole switch to a cascaded set of modulo-2 adders. Selective operation of the switch poles enables selection of which shift register stages contribute to a feedback signal generated by the cascaded modulo-2 adders. This feedback signal is directed via a second switch to a selected one of the shift register stages, according to the required number of active shift register stages; the second switch also supplies a clock signal to the currently active stages. A serious disadvantage with this arrangement is the use of a cascaded set of modulo-2 adders. The number of adders must be equal to the maximum possible number of shift register stages, and the feedback signal must propagate through all the adders irrespective of the number of stages which are currently active. This can impose a significant delay on the speed of generation of the feedback signal, and thus render the circuit unable to operate at the high speeds required for use with present and planned communications equipment.

Various designs for LFSR sequence generators are discussed in *Design Considerations for Parallel Pseudo-random Pattern Generators*, by Paul H. Bardell, Journal of Electronic Testing: Theory and Applications, 1, 73-87 (1990), including circuits described as 'variable-length linear feedback shift registers'. However the circuits disclosed provide only a small number of specific sequences, and although the degree of the characteristic polynomial can be changed, this is restricted to changes which do not involve rearranging the feedback connections.

In implementing a PRPG which can generate patterns having variable width and variable characteristic polynomial, it is necessary to be able to determine the characteristic polynomial which will result in a desired pattern. Known methods of accomplishing this have not been applicable generally to all possible patterns, and/or have incurred a heavy cost in terms of computation required to derive the polynomial.

DISCLOSURE OF INVENTION

According to one aspect of this invention there is provided apparatus for generating a pseudo-random binary pattern having a variable characteristic polynomial, comprising a plurality of LFSR sequence generators each for generating a respective LFSR sequence having a variable characteristic polynomial related to said pattern polynomial, each said generator being arranged to generate bits for one bit position of said pattern, and each comprising an input stage, at least one intermediate stage, and an output stage, said stages of each generator being coupled for sequential propagation of signals through those stages, and at least one of said stages in each generator being responsive to a respective control signal for that stage of that generator to determine whether signal propagation through that stage is influenced by a feedback signal for that generator, said control signal being related to said characteristic polynomial for the LFSR sequence, and wherein said control signal for each stage is derived by:

producing a portion of predetermined length of the bit sequence occurring at a selected bit position in said binary pattern; and deriving said control signal from said portion.

According to another aspect of this invention there is provided a method for generating a pseudo-random binary pattern having a variable characteristic polynomial, comprising generating a plurality of LFSR sequences each having a variable characteristic polynomial related to said pattern polynomial, each said LFSR sequence contributing bits for one bit position of said pattern, and generation of each LFSR sequence being responsive to a respective control signal to determine whether bit signal propagation contributing to that sequence is influenced by a feedback signal for that sequence, said control signal being related to said characteristic polynomial for the LFSR sequence, and wherein said control signal is derived by:

producing a portion of predetermined length of the bit sequence occurring at a selected bit position in said binary pattern; and deriving said control signal from said portion.

BRIEF DESCRIPTION OF DRAWINGS

A method and apparatus in accordance with this invention for generating LFSR sequences and pseudo-random binary patterns having variable characteristic polynomials will now be described, by way of example, with reference to the accompanying drawings, in which:

FIG. 3 is a block schematic diagram of a circuit for generating LFSR sequences and incorporating provision for variation of the characteristic polynomial;

BEST MODE FOR CARRYING OUT THE INVENTION, & INDUSTRIAL APPLICABILITY

Figure 1:
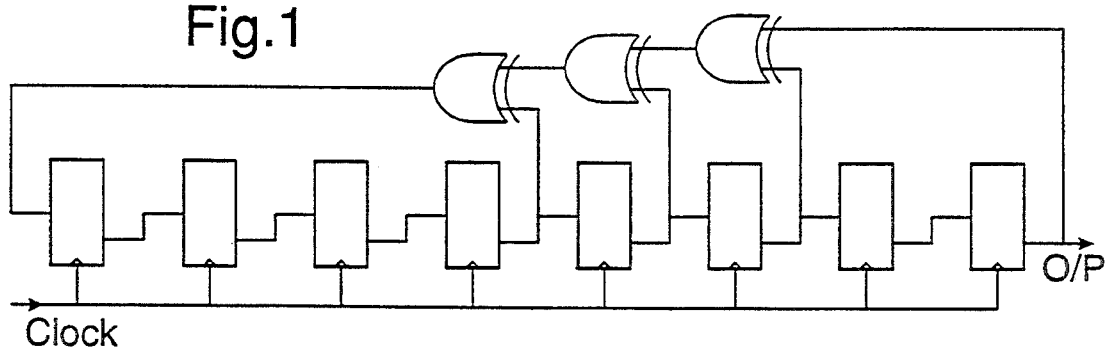
FIG. 1 shows a linear feedback shift register.

A generator for LFSR sequences having any characteristic polynomial up to and including degree twenty is shown in FIG. 3. This circuit also provides the function of a variable polynomial reciprocal divider.

Referring to FIG. 3, the generator 100 has twenty stages which (except for the output stage) have a uniform design, and one of which (the eighteenth stage, counting from the output) is identified between the dashed lines 102 and will be described in detail as being illustrative of this design. The operational state of the stage is stored as the state of a D-type latch or flip-flop 104, the Q output of which supplies an output signal S[18] for the stage. The D input of the latch 104 receives the output from a two-way multiplexer 106 which has two signal inputs and a control input receiving a control signal P[18] for this stage. When the signal P[18] has a value of zero, the multiplexer 106 switches the output signal S[19] from the preceding (nineteenth) stage to the D input of the latch 104; in response to a control signal P[18] of one, this multiplexer couples the latch's D input to receive the output signal from an exclusive-OR gate 108. This gate in turn receives as inputs the output signal S[19] from the preceding stage and the output signal S[1] on a feedback line 110 from the latch 104 in the first (output) stage of the generator.

As the twentieth stage of the generator has no preceding stage, there is no output signal from such a preceding stage to be supplied to the exclusive-OR gate and multiplexer in the twentieth stage. Instead a polarity control signal Pol is supplied to these circuits on a line 114. This Pol signal enables the values of the binary digits in the sequence produced by the generator to be inverted if required.

Each stage receives a clock signal on a line 116 to coordinate the operation of the latches 104. As each clock pulse occurs, each latch 104 in the second to twentieth stages accepts and stores the signal supplied via the associated multiplexer 106: either the modulo-2 sum (from the exclusive-OR gate 108) of the output signal from the previous stage (Pol signal for the twentieth stage) and the output signal S[1] from the output stage, or the output signal from the previous stage (or Pol signal) direct, in accordance with the value of the respective control signal P[2] to P[20].

The signal from the multiplexer 106 in the output stage is supplied to a multiplexer 112, which also receives a Seed data/Test data serial bit stream on a line 118 and a Seed/Run control signal on a line 120. If the Seed/Run signal has a value of 0 (the normal state), the multiplexer 112 supplies the signal from the multiplexer 106 (controlled by the signal P[1]) to the latch 104, which in turn supplies it as the S[1] signal to the feedback line 110 and (as part of a serial bit stream) to the output from the sequence generator; when the Seed/Run signal has a value of 1, the multiplexer 112 selects the Seed data/Test data serial bit stream instead.

The Seed data/Test data bit stream and the signal from the multiplexer 106 in the output stage are also supplied to an exclusive-OR gate 122, the output of which is connected to the D input of a D-type latch 124. This latch is clocked synchronously with the latches 104, and provides a latched error signal Err on a line 126 if the S[1] signal and the Seed data/Test data signal differ. This facility is included for use when the generator is providing a reference sequence for comparison with a sequence received via a system under test.

The sequence generator is controlled to produce a sequence having a particular characteristic polynomial by applying appropriate control signals P[1] to P[20]. A control signal has a value of 1 if the corresponding term of the characteristic polynomial has a coefficient of 1. If the characteristic polynomial is of degree less than twenty, unused control signals such as P[20] are set to 0. Thus for the characteristic polynomial of degree eight $$x^8 + x^6 + x^5 + x^4 + 1$$

the control signals P[8], P[6], P[5] and P[4] would be set to 1; all other control signals P[20] etc. would be set to 0.

The initial contents of the latches 104 are determined by using the Seed/Run signal input in conjunction with the Seed data/Test data input. When it is required to initialize the contents of the latches 104, a binary 1 signal is applied to the Seed/Run input for the duration of twenty clock pulses. Twenty binary digits defining the required initializing or seed value for the generator are applied to the Seed data/Test data input in synchronism with the clock pulses. These twenty bits comprise the portion of the sequence immediately preceding the point at which the output signal from the generator is required to commence. The content of this portion may be determined, for example, by calculating the sequence in reverse from the desired starting point, using the characteristic polynomial, and storing the values of the twenty bits in the sequence preceding that point. The seed value must be twenty bits long, irrespective of the degree of the characteristic polynomial, in order to ensure that the value of the polarity control signal Pol has propagated through to the output stage before output signals from the generator are utilized.

If it is unimportant where in the sequence the generator output commences, then any seed value, other than all zeroes or all ones (depending on the polarity), may be used.

Figure 4:
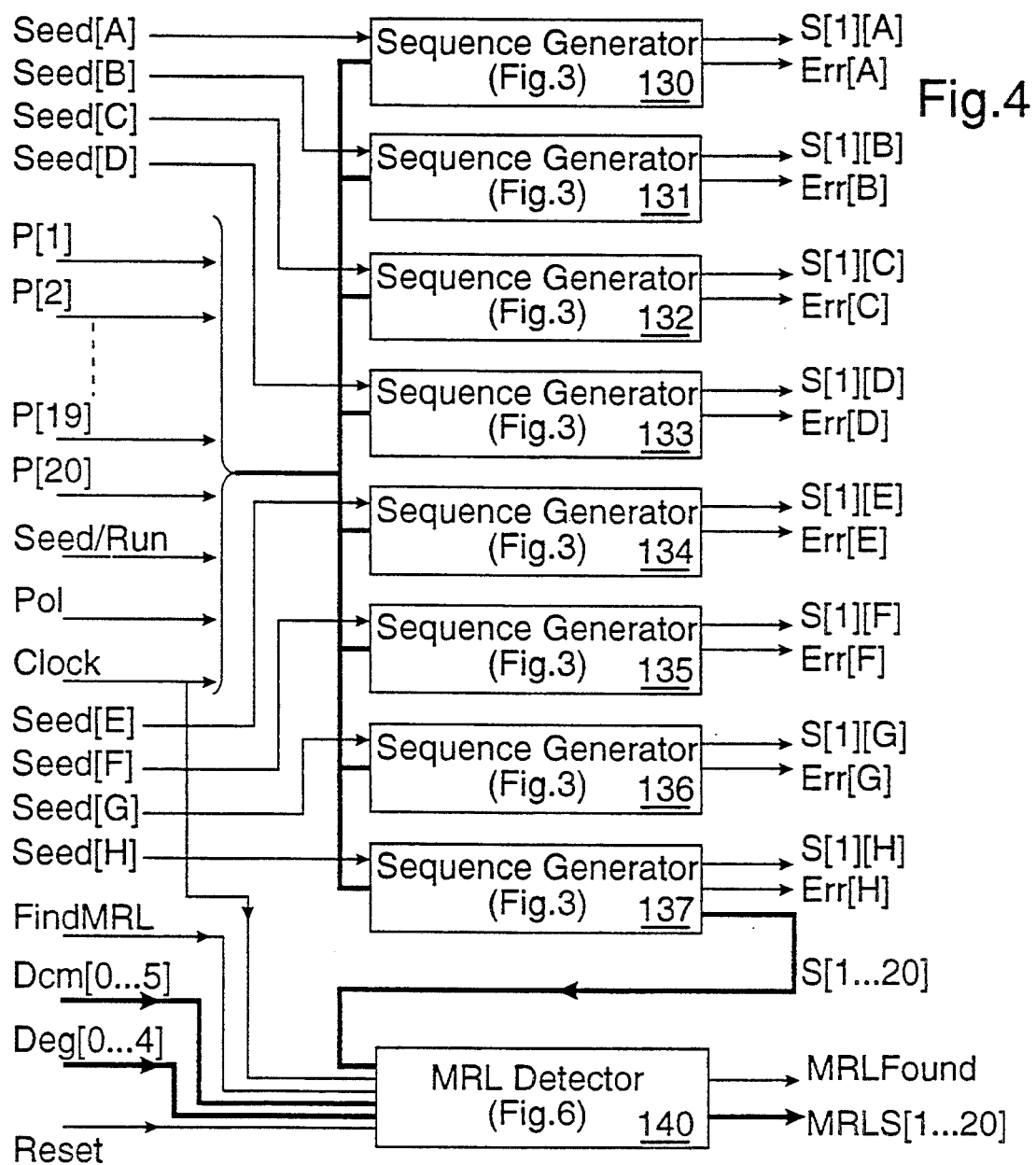
FIG. 4 is a block schematic diagram of a pseudo-random pattern generator incorporating eight circuits as shown in FIG. 3.
Figure 2:
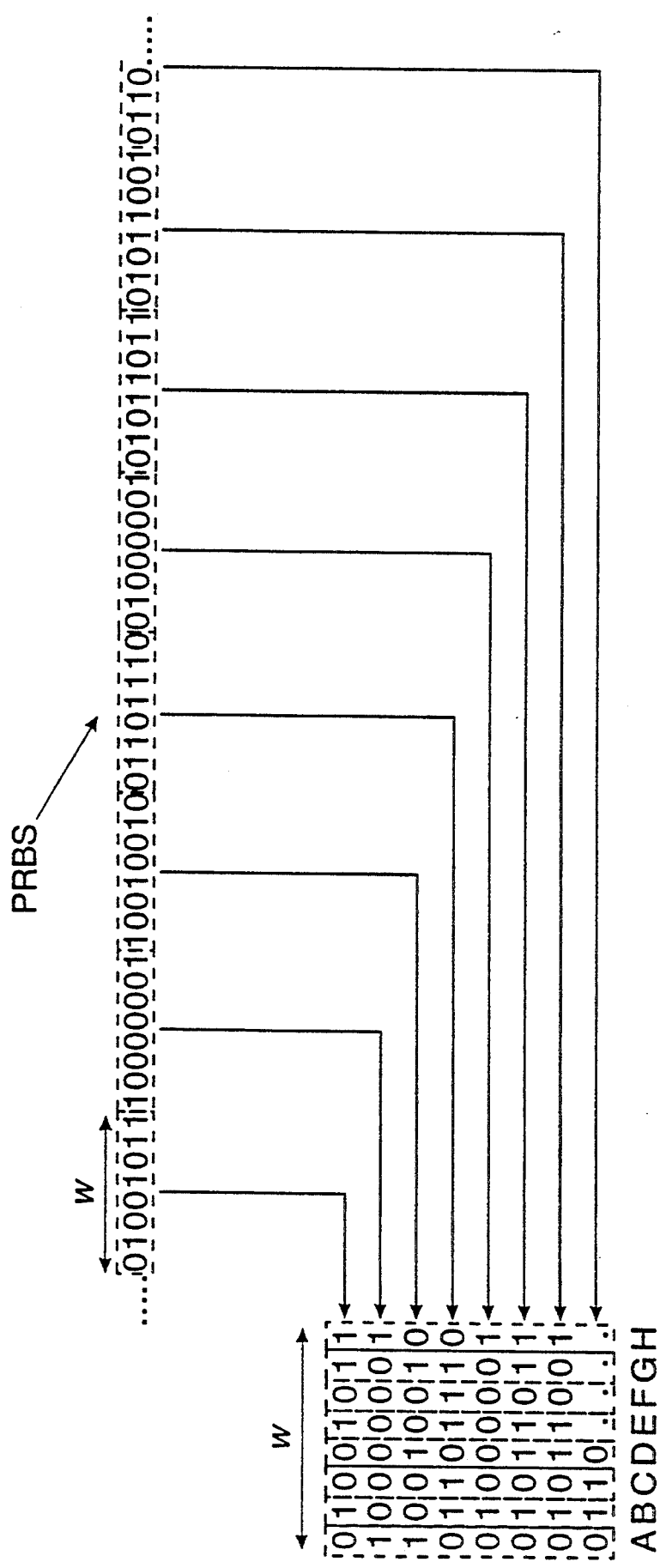
FIG. 2 shows part of a PRBS and decimations thereof.

A pseudo-random pattern generator (PRPG) for generating a pseudo-random test pattern w bits wide comprises w sequence generators of the kind shown in FIG. 3. For example, a PRPG for generating a test pattern eight bits wide is shown in FIG. 4. Normal weight lines in FIG. 4 indicate single signal paths, whilst heavy lines indicate multiple signal paths drawn as a single line for the sake of clarity.

Referring to FIG. 4, there are eight sequence generators 130 to 137. Each of these generators receives the control signals P[1] to P[20] defining the required characteristic polynomial, the Seed/Run control signal, the Pol control signal and a clock signal. In addition each generator has an individual Seed data/Test data input line (identified as Seed in FIG. 4) for receiving seed values and, if required, test values specific to that generator. Each generator 130 to 137 has a respective one of output lines S[1][A] to S[1][H], providing a serial bit sequence, and a respective one of error signal lines Err[A] to Err[H].

As shown in FIG. 4, the PRPG may also include a maximal run length (MRL) detector 140, described in more detail below, to identify a maximal length sequence or 'run' of binary 1 digits in the output from the sequence generator 137, and the contents of the sequence generator when this maximal length run occurs, for use in the derivation of the characteristic polynomial of certain decimated sequences.

Figure 5:
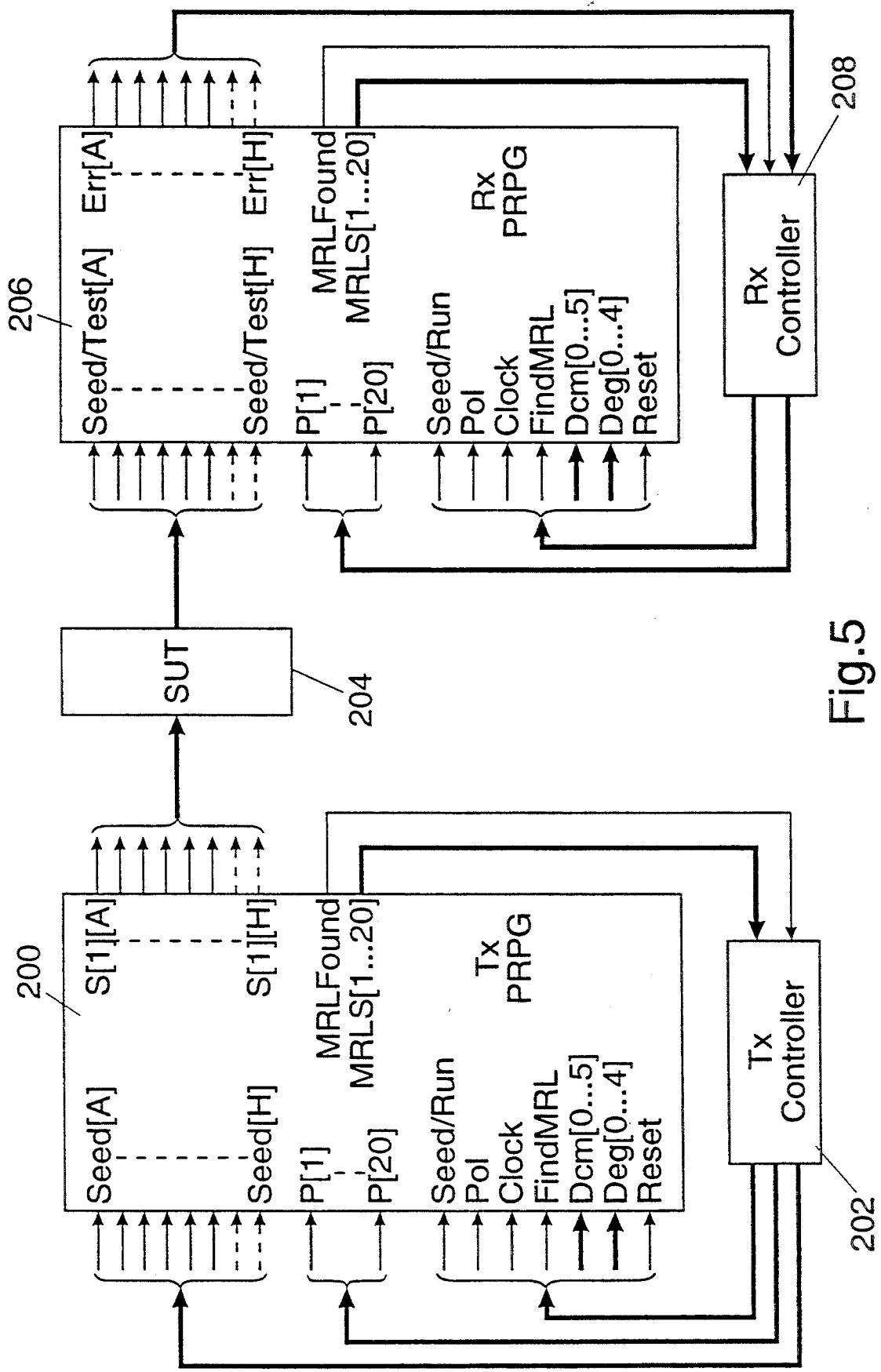
FIG. 5 is a block schematic diagram of an arrangement for testing the bit-error rate of a system and incorporating two pseudo-random pattern generators as shown in FIG. 4.

Testing of, for example, the bit-error rate of a system typically involves an arrangement, as shown in FIG. 5, incorporating two PRPG's as described above with reference to FIG. 4.

Referring to FIG. 5, the arrangement has a first, transmit fix) PRPG 200 and an assocated Tx controller 202. Some or all of the output lines S[1][A] to S[1][H] of the Tx PRPG are coupled to the input of the system under test (SUT) 204, the output of which is coupled to the Seed data/Test data inputs of a second, receive (Rx) PRPG 206, which has an associated Rx controller 208. The Rx controller 208 is coupled to receive the signals on the error signal lines from the Rx PRPG 206.

The Tx controller 202 provides input signals to the Seed data/Test data inputs of the Tx PRPG 200, in accordance with the required seed values for each of the sequence generators in use in the Tx PRPG 200.

As indicated by the dashed lines for some of the Seed, Seed/Test, S[1] and Err lines in FIG. 5, the precise number of lines actually used in any specific test arrangement will depend upon the required width w of the test pattern word to be applied to the SUT 204.

The Tx controller 202 supplies control signals P[1] to P[20] to the Tx PRPG 200, together with Seed/Run, Pol and Clock signals. The Rx controller 208 has corresponding connections to the Rx PRPG 206. If the MRL detector 140 is present in each PRPG, the controllers 202 and 208 also supply FindMRL, Dcm[0] to Dcm[5], Deg[0] to Deg[4] and Reset signals to, and receive MRLFound and MRLS[1] to MRLS[20] signals from, the associated PRPG; these signals are described below with reference to FIG. 6.

Depending on the configuration of the SUT 204 (e.g. a small, compact unit with input and output in close proximity, or a large system with remote input and output) the Tx and Rx controllers 202 and 208 may be coupled to a common supervisory unit (not shown) or may have respective separate supervisory facilities. The supervisory unit or facilities may, for example, comprise part of an automatic test equipment and/or may have provision for operator control via a user interface.

The required width w of the test pattern word and the characteristic polynomial of the overall PRBS to be generated by the PRPG's 200 and 206 are input to the controllers 202 and 208, for example via a supervisory unit. The controllers then derive, using the procedure described below, the characteristic polynomial for the LFSR sequences which when supplied in parallel will produce the required PRBS.

In the case of the Tx controller 202 the appropriate seed values for the sequence generators 130 to 137 in the Tx PRPG 200 are also derived. This may be done, for example, by calculating from the characteristic polynomial of the overall PRBS a portion 20 w bits in length of that overall sequence, and then decimating the generated portion with a decimation interval of w to obtain w sets of seed values each twenty bits in length. Thus the seed values would comprise the following bits of the generated portion:

seed A: bits 1, $w+1$, $2w+1$, $3w+1$, $4w+1$, ... ,$19w+1$
seed B: bits 2, $w+2$, $2w+2$, $3w+2$, $4w+2$, ... ,$19w+2$
seed C: bits 3, $w+3$, $2w+3$, $3w+3$, $4w+3$, ... ,$19w+3$
seed D: bits 4, $w+4$, $2w+4$, $3w+4$, $4w+4$, ... ,$19w+4$ etc.

Each controller 202 and 208 applies the control signals defining the polynomial for the individual LFSR sequences to its associated PRPG, on the lines P[1] to P[20], and the required polarity on the line Pol, and then starts the clock signal on the clock input.

For the first twenty clock pulses the Seed/Run signal for the Tx PRPG 200 is set to binary 1. The seed values for each of the sequence generators in use are supplied in synchronism with these clock pulses, on the Seed data/Test data lines of the Tx PRPG 200. The Seed/Run signal for this PRPG is then set to binary 0, and thereafter the Tx PRPG generates successive words of the required PRBS. The PRBS is applied to the SUT 204, the output signals from which are supplied to the Rx PRPG 206.

Initially the Rx controller 208 also sets the Seed/Run signal for the Rx PRPG 206 to binary 1. Accordingly, the output signals from the SUT 204 are treated by the Rx PRPG 206 as seed data, to determine the initial contents of the latches 104 in each of its sequence generators 130 to 137 which are in use. At the same time, the exclusive-OR gate 122 in each sequence generator in the Rx PRPG 206 compares the reference sequence being generated locally by that sequence generator with the corresponding sequence being received by that generator from the SUT 204, and controls the respective Err signal accordingly.

So long as the rate of occurrence of signals on the Err lines exceeds some preset error rate threshold, indicating an excessive discrepancy between the locally generated and received sequences for at least one of the sequence generators, the Rx controller 208 continues to apply a binary 1 to the Seed/Run control of the Rx PRPG 206. Eventually however, and assuming there is no malfunction in the SUT 204, total discrepancies between the locally generated and received sequences for all the sequence generators will fall below the preset error rate threshold. At this point the Rx controller 208 switches the Seed/Run control signal to binary 0. Thereafter the Rx PRPG 206 continues to generate the reference LFSR sequences independently, and compares them with the output signals from the SUT 204. Any discrepancy between the two sets of signals will cause an error signal to appear on one or more of the lines Err[A] to Err[H]. If the rate of occurrence of these error signals exceeds the preset threshold, the Rx controller 208 indicates a fault to the supervisory unit, and re-applies a binary 1 to the Seed/Run control of the Rx PRPG 206, so that it can, if possible, re-synchronize itself with the LFSR sequences being generated by the Tx PRPG 200.

As noted above, the operation of the test arrangement shown in FIG. 5 requires the derivation of the characteristic polynomial which will enable the Tx PRPG 200 to generate any specified PRBS.

In the case where the width w of the test pattern word, and therefore the decimation interval of the overall PRBS, is a positive integer power of 2, the characteristic polynomial for each of the LFSR sequences is the same as that of the overall PRBS.

For other values of w the derivation of the required polynomial may be accomplished by first observing that for a given decimation interval (or word width) w, the required LFSR sequences which when multiplexer together will form a specified PRBS of length $2^n - 1$ can all be generated using a single characteristic polynomial of degree no greater than n. Accordingly 2n consecutive bits of any of the required LFSR sequences (apart from LFSR sequences comprising all zeroes) enable the characteristic polynomial to be determined, by means of the Berlekamp-Massey algorithm. The principles of this algorithm are set out, for example, in *Theory and Practice of Error Control Codes*, by R. E. Blahut, Addison-Wesley, Massachusetts, USA, 1983. The algorithm may be implemented for the present purpose by the following program in the C programming language:

Alternatively, in the case of proper decimations of an overall PRBS (i.e. where the word width w has no common prime factors with the length $2^n1$ of the overall PRBS), the required polynomial may be derived from a portion immediately following the maximal run length sequence of n binary 1 digits in a decimation with an interval w of the overall PRBS (e.g. a sequence of eight consecutive binary 1's in a proper decimation of a PRBS having the characteristic polynomial (1)). The location of the maximal run length sequence, and the determination of the associated state of the sequence generator when that sequence occurs, may be accomplished using the MRL detector 140 of FIG. 4, shown in more detail in FIG. 6.

The MRL detector 140 receives a FindMRL control signal to initiate detection of the maximal length run, a Reset control signal and the clock signal. The detector 140 also receives a six-bit signal Dcm[0] to Dcm[5] which defines the interval of the decimation (equal to the width w of the pseudo-random pattern being generated); a six-bit value enables decimation intervals of up to sixty-three to be accommodated. In the case of the PRPG of FIG. 4 the signal Dcm would have a maximum value w of eight (binary 001000), corresponding to the total number of sequence generators 130 to 137.

A five-bit input signal Deg[0] to Deg[4] to the detector 140 defines the degree of the characteristic polynomial for the PRBS being decimated, and thus the length of the maximal run to be detected. In the case of the polynomial (1), the signal Deg would have a value of eight (binary 01000).

The S[1] output signal from the sequence generator 137 is supplied to the detector 140 for monitoring for occurrence of the maximal length run, and, together with the remaining output lines S[2] to S[20], for identification of the contents of the sequence generator when this run occurs.

The detector 140 has an output line MRLFound, for a signal indicating that the maximal length run has been detected, and a set of twenty output lines MRLS[1] to MRLS[20] indicating the contents of the sequence generator 137 at the end of the maximal length run. The signal on the MRLFound output line can be reset via the Reset input line to the detector 140.

Figure 6:
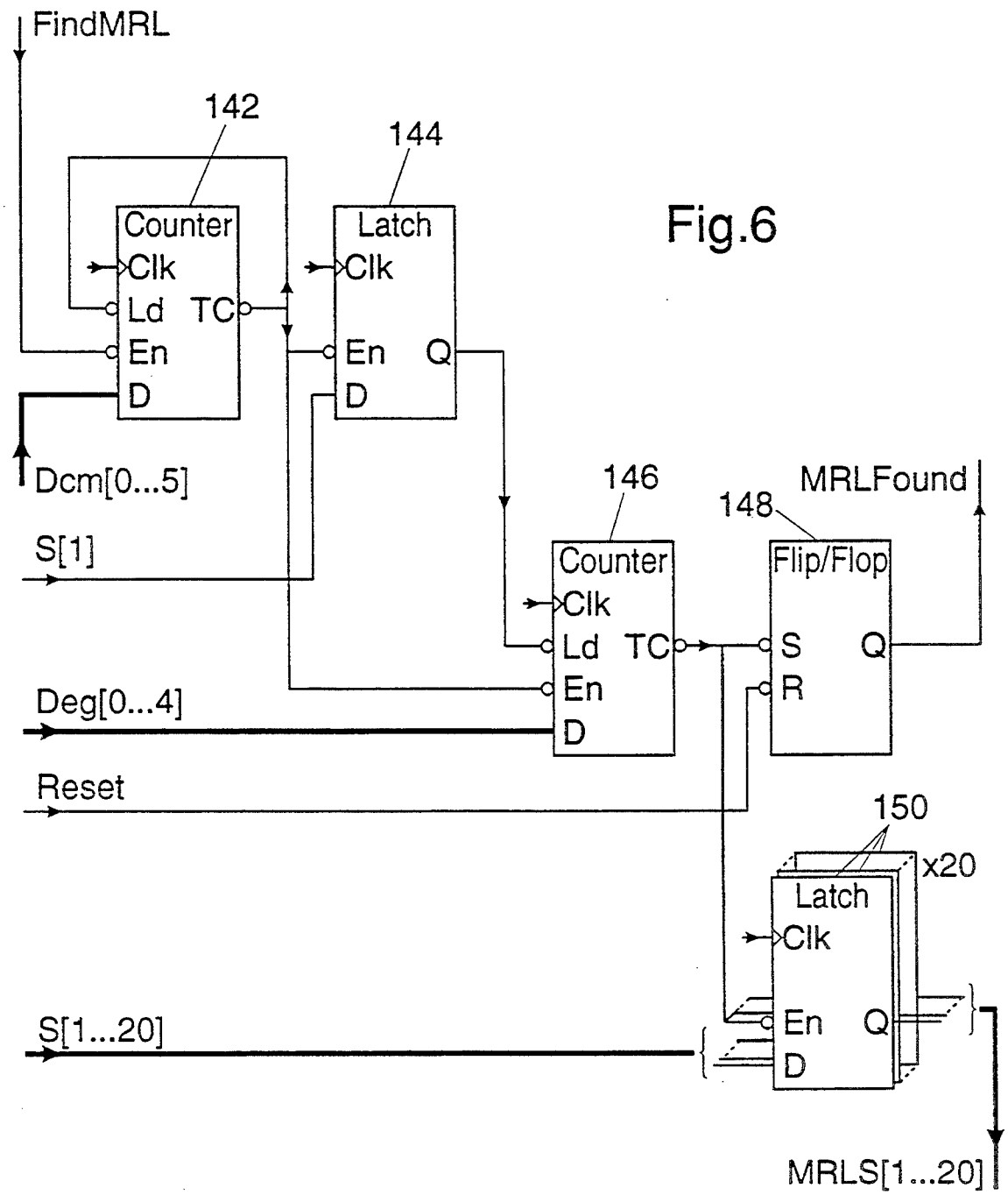
FIG. 6 is a block schematic diagram of a circuit for detecting occurrence of a maximal length run of binary 1 digits in a pseudo-random binary sequence.

Referring to FIG. 6, the six-bit Dcm signal w is coupled to the data input D of a count-down counter 142 which also receives the FindMRL signal on its enable* input En (where enable* indicates an enable input which is active-low). The terminal-count* output TC of this counter is coupled to its load-data* input -Ld, to the enable* input of a D-type latch 144 and the enable* input of a second count-down counter 146.

The load-data* input of the D-type latch 144 receives the S[1] output from the sequence generator 137, and the Q output of this latch is coupled to the load-data* input of the counter 146. The data input D of this counter receives the five-bit Deg signal, and the terminal-count* output is coupled to the set* input S of an SR flip-flop 148 and to the enable* inputs of a group of twenty D-type latches 150. The reset* input R of the flip-flop 148 receives the Reset signal, and its Q output supplies the MRLFound signal.

The D inputs of the latches 150 receive respective ones of the output signals S[1] to S[20] from the sequence generator 137, and their Q outputs supply corresponding ones of the output signals MRLS[1] to MRLS[20].

Each of the counters 142, 146 and latches 144, 150 also receives the clock signal at its clock input.

When it is desired to identify a maximal length run in a decimation of an overall PRBS, the P[1] to P[20] control signals are applied to the PRPG with values corresponding to the characteristic polynomial of that PRBS, and the polarity control signal Pol is set to 0. The clock signal is started and an appropriate seed value is clocked into the sequence generator 137.

A Reset signal is applied to clear the MRLFound output, and a low input is then applied to the FindMRL line, to enable counting by the counter 142. As each clock pulse occurs the counter 142 decrements its initial count, until it reaches zero. At this point the terminal-count* output of the counter activates the load-data* input, causing the counter to be reset to the total count w defined by the six-bit Dcm signal; in addition, the latch 144 accepts and stores the current value of the output signal S[1] from the sequence generator 137, and the counter 146 is enabled to decrement its count.

After an additional number w of clock pulses, as defined by the Dcm signal, the counter 142 is again reset, the value of the S[1] signal is latched by the latch 144 and the counter 146 decrements its count. The value thus latched by the latch 144 is spaced by w bits in the S[1] bit stream from the previous value accepted by this latch. Thus the sequence of bits appearing at the output Q of the latch 144 constitutes the required decimation of the S[1] bit stream with a decimation interval of w.

This process continues as long as the latched value of the S[1] signal remains at binary 1. If this value becomes binary 0, the load-data* input of the counter 146 is activated, causing the count in this counter to be reset to its starting value. Thus, for any sequence of binary 1's in the decimated sequence which is shorter than the maximal length, the binary 0 following that sequence will reset the count in the counter 146.

When the maximal length run does occur, the counter 146 will be able to count down to zero, whereupon its terminal-count* output TC will set the SR flip-flop 148 to activate the MRLFound output, and will also enable the group of D-type latches 150. These latches accept and store the values of the output signals S[1] to S[20] from the sequence generator 137 at this point, and make them available on the output lines MRLS[1] to MRLS[20] for calculation of the required characteristic polynomial.

Given the state of the sequence generator 137 at that point (as provided on the output lines MRLS[1] to MRLS[20]), the portion of the decimated sequence immediately following the maximal run length sequence can be derived by computing further bits of the overall PRBS from its known polynomial and the generator state found by the MRL detector, and selecting every wth one of those further bits. A total of n bits must be selected, where n is the degree of the characteristic polynomial of the overall PRBS.

Taking as an example a (decimated) PRBS with a characteristic polynomial of degree n=6 for which the n selected bits are found to be 001010, the polynomial is derived as follows. The n selected bits are known to be preceded by the maximum length run of binary 1 digits, giving the following sample sequence in which the n selected bits are labelled U to Z:

| 1 | 1 | 1 | 1 | 1 | 1 | 0 | 0 | 1 | 0 | 1 | 0 |
|---|---|---|---|---|---|---|---|---|---|---|---|
|   |   |   |   |   |   | U | V | W | X | Y | Z |

The characteristic polynomial has the general form $$h_6x^6 + h_5x^5 + h_4x^4 + h_3x^3 + h_2x^2 + h_1x + 1 \tag{2}$$

where the coefficients $h_1$ to $h_6$ each have the value 1 or 0 depending on whether the associated term x to $x^6$ is present in the polynomial or not. Each successive bit b in the sequence is related to its six preceding bits by the expression (in modulo-2 arithmetic)

$$b = h_6b_{-6} + h_5b_{-5} + h_4b_{-4} + h_3b_{-3} + h_2b_{-2} + h_1b_{-1} \tag{3}$$

where $b_{-1}$ indicates the bit immediately preceding bit b, and $b_{-6}$ indicates the bit occurring six bit positions before bit b. The requirement is to determine the values for $h_1$ to $h_6$. This can be done by evaluating expression (3) for each of the selected bits U to Z, substituting the actual bit values for the terms $b_{-1}$ to $b_{-6}$. The resulting equations for bits U and V are set out below, with the sample sequence alongside showing the substituted bit values underlined:

111111001010
$$U = 0 = (h_6*1 + h_5*1 + h_4*1 + h_3*1 + h_2*1) + h_1*1 \tag{4}$$

111111001010
$$V = 0 = (h_6*1 + h_5*1 + h_4*1 + h_3*1) + h_2*1 + 0 \tag{5}$$

The final term in equation (5) can be set to 0, irrespective of the value of $h_1$, because bit $b_{-1}$ for this equation is known to be 0. It can be seen that equation (5) for bit V is equivalent to the portion in parentheses of equation (4) for bit U; furthermore, bit V is known, from the n selected bits, to be equal to 0. Substituting this value for the portion in parentheses of equation (4) for bit U immediately yields a value of 0 for $h_1$. The equation for bit W can now be formulated in a similar manner, including this value for $h_1$:

$$111111001010$$
$$W=1=(h_6*1+h_5*1+h_4*1)+h_3*1+0+0*0 \qquad (6)$$

Again the penultimate term can be set to 0, irrespective of the actual value of $h_2$, because bit $b_{-2}$ is known to be 0. Substituting the known value of 1 for bit W in place of the portion in parentheses of equation (5) yields a value of 1 for $h_2$ (since all arithmetic in this context is modulo 2, signs may be ignored). Repeating this procedure for bit X yields:

$$111111001010X=0=(h_6*1+h_5*1)+h_4*130$$
$$0+1*0+0*1 \qquad (7)$$

and substituting this into equation (6) gives a value of 1 for $h_3$. The equation for bit Y is:

$$111111001010Y=1=(h_6*1)+h_5*1+0+1*0+1*1+0*0 \qquad (8)$$

from which the portion of equation (7) in parentheses can be seen to be equal to 0, giving a value of 0 for $h_4$. Finally the equation for bit Z is:

$$111111001010$$
$$Z=0=h_6*1+0+0*0+1*1+1*0+0*1 \qquad (9)$$

giving a value of 1 for $h_6$ and, from equation (8), a value of 1 for $h_5$. Accordingly the required polynomial is $$x^6+x^5+x^3+x^2+1 \qquad (10)$$

```
/*
calculates characteristic polynomial of decimated subsequences
of a pseudo-random binary sequence using Berlekamp-Massey algorithm
*/ define M 100      /* PRBS has length 2^{n}-1, n <= M */ short lfsr();

main()
{
        short       s[2*M +1];
        short       h[M+1];
        short       dec_h[2*M +1];
        short       shift_reg[M];
        int         n;
        int         w;
        int         i;

/* Input characteristic polynomial of PRBS and decimation interval */
        printf("Input polynomial degree\n");
        scanf("%d", &n);

for (i = 0; i <= n; i++)
                h[i] = 0;
        printf("Input powers of x for which coefficients of polynomial ");
        printf("are nonzero,\nending with -1\n");
        while (1)
        {
                scanf("%d", &i);
                if (i == -1)
                        break;
                else
                        h[i] = 1;
        }
        printf("Input decimation interval\n");
        scanf("%d", &w);
```

```c
/* Calculate 2n consecutive bits of PRBS at decimation w,
   initialising PRBS with all 1's */
for (i = 0; i < n; i++)
    shift_reg[i] = 1;

s[1] = 1;   /* Set first bit of decimated subsequence to 1 */
for (i = 2; i <= 2*n; i++)
    s[i] = lfsr(shift_reg, h, n, w);

/* Calculate characteristic polynomial for decimated subsequence */
bm_f2(s, dec_h, n);

/* Output result */
printf("\nCharacteristic polynomial for decimated subsequence ");
printf("has nonzero coefficients\nfor following powers of x:\n");
for (i = n; i >= 0; i--)
    if (dec_h[i] != 0)
        printf("%3d", i);
printf("\n");

/* The following test code would check that next 100 bits of
   decimated subsequence are same as those produced by polynomial
   dec_h(x)
for (i = 0; i<100; i++)
    if (lfsr(shift_reg, h, n, w) != lfsr(s+n+1, dec_h, n, 1))
        printf("Error\n");
*/
}

/* Update linear feedback shift register (comprising n stages) by w shifts
   using polynomial
*/
short lfsr(shift_reg, poly, n, w)
short     shift_reg[M];
short     poly[M+1];
int       n;
int       w;
{
    short new;
    int   i, j;

for (i = 0; i < w; i++)
    {
        /* Calculate new shift register element as
           \sum_{j = 1}^{n} poly_{j} shift_reg[n-j]
        */
        new = 0;
        for (j = 1; j <= n; j++)
            if (poly[j] == 1 && shift_reg[n-j] == 1)
                new = 1 - new;

/* Shift contents of register */
        for (j = 0; j < n-1; j++)
```

```
                    shift_reg[j] = shift_reg[j+1];
            shift_reg[n-1] = new;
        } return(new);
}

/*
Berlekamp-Massey algorithm over the field F_{2}. Finds minimal shift
register polynomial lambda[] which produces s[1], s[2], ... s[2t] as output
*/
bm_f2(s, lambda, t)
short  s[2*M +1], lambda[2*M +1];
int    t;
{
        short b[2*M +1];
        short c[2*M +1];
        int   ell;
        int   delta;
        int   r, j;

/* Initialise (iteration r=0) */
        ell = 0;
        lambda[0] = b[0] = 1;
        for (j = 1; j <= 2*t; j++)
                lambda[j] = b[j] = 0;

/* Recursively calculate shift register lambda[] */
        for (r = 1; r <= 2*t; r++)
        {
                /* Calculate delta */
                delta = 0;
                for (j = 0; j <= ell; j++)
                        if (lambda[j] == 1  &&  s[r-j] == 1)
                                delta = 1 - delta;

/* Copy lambda[] into c[] */
                for (j = 0; j <= ell; j++)
                        c[j] = lambda[j];

/* Update shift register lambda[] */
                if (delta != 0)
                {
                        for (j = 1; j <= r; j++)
                                if (b[j-1] != 0)
                                        lambda[j] = 1 - lambda[j];
                }

/* Update b[] and ell */
                if (delta != 0  &&  2*ell <= r-1)
                {
                        for (j = 0; j <= ell; j++)
                                b[j] = c[j];
```

```
        for (j = ell+1; j <= r; j++)
            b[j] = 0;

ell = r - ell;
    }
    else
    {
        for (j = r; j >= 1; j--)
            b[j] = b[j-1];
        b[0] = 0;
    }
  }
}
```

We claim:

1. Apparatus for generating a pseudo-random binary pattern having a variable characteristic polynomial, said pseudo-random binary pattern formed as a plurality of serial bit streams, corresponding bits in each said stream forming together one of successive w-bits words in said binary pattern, comprising:
  a plurality of LFSR sequence generators, each said LFSR sequence generator arranged to generate bits for one of said serial bit streams and including a plurality of stages, said stages having an input stage, at least one intermediate stage, and an output stage, said stages being coupled for sequential propagation of signals through said stages, and at least one of said stages in each LFSR generator being responsive to a respective control signal for that stage to determine whether signal propagation through said stage is influenced by a feedback signal for that LFSR generator; and means for producing in accordance with said variable characteristic polynomial a portion of predetermined length of one of said serial bit streams, and deriving said control signal from said portion.

2. The apparatus of claim 1, wherein said pseudo-random binary pattern is $2^n 1$ bits in length, and said portion comprises at least 2n bits.

3. The apparatus of claim 2, wherein said control signal for each stage is derived from said portion in accordance with the Berlekamp-Massey algorithm.

4. The apparatus of claim 1, including means for detecting occurrence of a maximal length sequence of bits of a predetermined value.

5. The apparatus of claim 1, wherein said control signal is related to said characteristic polynomial for the LFSR sequence such that signal propagation through a stage corresponding to a term of the polynomial having a non-zero coefficient is influenced by said feedback signal.

6. The apparatus of claim 5, wherein said feedback signal for a generator comprises an output signal from said output stage of that generator.

7. The apparatus of claim 6, wherein each stage comprises:
  store means for storing a signal representative of the operational state of the stage;
  means for summing, modulo-2, an input signal for the stage and said output signal from said output stage to produce a sum signal; and
  switch means responsive to said control signal for said stage to couple a selected one of said input signal and said sum signal to said store means;
  each of said intermediate and output stages receiving as its said input signal an output signal from its respective preceding stage.

8. The apparatus of claim 7, wherein said summing means comprises an exclusive-OR gate.

9. The apparatus of claim 7, wherein said switch means comprises a multiplexer.

10. The apparatus of claim 7, wherein said store means comprises a D-type latch circuit.

11. The apparatus of claim 7, wherein said output stage includes output switch means for selecting one of a signal representative of the operational state of said output stage and a signal at an input terminal, said output signal from the output stage being derived from the signal selected by said output switch means, and said signal representative of the operational state of said output stage is taken from the switch means in said output stage.

12. The apparatus of claim 1, wherein said output stage includes output switch means for selecting one of a signal representative of the operational state of said output stage and a signal at an input terminal, said output signal from the output stage being derived from the signal selected by said output switch means.

13. A method for generating a pseudo-random binary pattern having a variable characteristic polynomial, said pseudo-random binary pattern formed as a plurality of serial bit streams, corresponding bits in each said stream forming together one of successive w-bit words in said binary pattern, comprising:
  arranging a plurality of LFSR generators, such that each of said LFSR generators generates bits for one of said serial bit streams and each of said LFSR generators has an input stage, at least one intermediate stage and an output stage, said stages being coupled for sequential propagation of signals through said stages, and at least one of said stages in each LFSR generator being responsive to a respective control signal for that stage to determine whether signal propagation through that stage is influenced by a feedback signal for that LFSR generator;
  producing in accordance with said variable characteristic polynomial a portion of predetermined length of one of said serial bit streams; and
  deriving said control signal from said portion.

14. The method of claim 13, wherein said pseudo-random binary pattern is $2^n - 1$ bits in length, and said portion comprises at least 2n bits.

15. The method of claim 14, wherein said control signal is derived from said portion in accordance with the Berlekamp-Massey algorithm.

16. The method of claim 13, wherein said bit signal propagation is influenced by said feedback signal in respect of propagation steps for which said control signal has a value indicative of a non-zero coefficient in the corresponding term of said characteristic polynomial for the LFSR sequence.

* * * * *

UNITED STATES PATENT AND TRADEMARK OFFICE
CERTIFICATE OF CORRECTION

PATENT NO. : 5,446,683
DATED : August 29, 1995
INVENTOR(S) : Sean F. Mullen and Jonathan Jedwab It is certified that error appears in the above-indentified patent and that said Letters Patent is hereby corrected as shown below:

Title page, item [75], left column, please correct the spelling/the second inventor's last name from "Jebwab" to -- Jedwab --.

Column 1, line 28, change "n" to --$n$--.

Column 1, line 29, change "$2^n 1$" to --$2^n$-1--.

Column 1, line 65, change "w" (both occur.) to --$w$--.

Column 2, line 3, change "w" to --$w$--.

Column 2, line 11, change "w" to --$w$--.

Column 2, line 13, change "w" to --$w$--.

Column 3, line 19 change "and-" to --and--.

Column 5, line 10, change "Seed/-" to --Seed/--.

Column 5, lines 64 and 65 (both occur.), change "w" to --$w$--.

Column 6, line 28, change "fix)" to --(1x)--.

Column 6, line 43, change "w" to --$w$--.

Column 6, line 64, change "w" to --$w$--.

Column 7, line 8, change "w" to --$w$--.

UNITED STATES PATENT AND TRADEMARK OFFICE
CERTIFICATE OF CORRECTION

PATENT NO. : 5,446,683
DATED : August 29, 1995
INVENTOR(S) : Sean F. Mullen and Jonathan Jedwab It is certified that error appears in the above-indentified patent and that said Letters Patent is hereby corrected as shown below:

Column 7, line 10, change "w" (both occur.) to --$w$--.

Column 7, lines 15 - 22, change "w" (20 occur.) to --$w$--.

Column 7, line 32, change "Seed/-" to --Seed/--.

Column 7, line 34, after "PRPG" add --200--.

Column 8, line 10, change "w" to --$w$--.

Column 8, line 15, change "w" to --$w$--.

Column 8, line 17, change "w" to --$w$--.

Column 8, line 18, change "multiplexer" to --multiplexed--.

Column 8, line 21, change "n" (both occur.) to --$n$--.

Column 8, lines 31- 32 delete "following" and change "language:" to -- language which appears after line 20 of columns 11 and 12--.

Column 8, line 35, change "w" to --$w$--.

Column 8, line 36, change "2$n$1" to --$2^n$-1--.

Column 8, line 39, change "n" to --$n$--.

UNITED STATES PATENT AND TRADEMARK OFFICE
CERTIFICATE OF CORRECTION

Page 3 of 6

PATENT NO. : 5,446,683
DATED : August 29, 1995
INVENTOR(S) : Sean F. Mullen and Jonathan Jedwab It is certified that error appears in the above-indentified patent and that said Letters Patent is hereby corrected as shown below:

Column 8, line 40, change "w" to --*w*--.

Column 8, line 53, change "w" to --*w*--.

Column 8, line 57, change "w" to --*w*--.

Column 9, line 10, change "w" to --*w*--.

Column 9, line 15, change "input-Ld," to input Ld,--.

Column 9, line 50, change "w" to --*w*--.

Column 9, line 54, change "w" to --*w*--.

Column 9, line 58, change "w" to --*w*--.

Column 9, line 62, change "w" to --*w*--.

Column 10, line 20, change "with" to --*with*--.

Column 10, line 20, change "n" to --*n*--.

Column 10, line 21, change "n" to --*n*--.

Column 10, lines 24, 25 and 26 (3 occur.) change "n" to --*n*--.

Column 10, line 28, change "n" to --*n*--.

UNITED STATES PATENT AND TRADEMARK OFFICE
CERTIFICATE OF CORRECTION

PATENT NO. : 5,446,683
DATED : August 29, 1995
INVENTOR(S) : Sean F. Mullen and Jonathan Jedwab It is certified that error appears in the above-indentified patent and that said Letters Patent is hereby corrected as shown below:

Column 10, line 41, change "b" to --$b$--.

Column 10, line 45, undo *italics* formatting.

Column 10, line 45, change "$h_1$b-" to --$h_1$b--.

Column 10, line 48, change "b" to --$b$--.

Column 10, line 50, change "b" to --$b$--.

Column 10, line 58, change "111111001010" to --111111001010--.

Column 10, line 58, undo *italics* formatting.

Column 10, line 60, change "111111001010" to --111111001010--.

Column 10, line 61, undo *italics* formatting.

Column 10, line 67, change "n" to --$n$--.

Column 11, line 5, change 111111001010 to --111111001010--.

Column 11, line 12, change "modulo 2" to --modulo-2--.

Column 11, line 15, change 111111001010 to --111111001010--.

UNITED STATES PATENT AND TRADEMARK OFFICE
CERTIFICATE OF CORRECTION

PATENT NO. : 5,446,683
DATED : August 29, 1995
INVENTOR(S) : Sean F. Mullen and Jonathan Jedwab It is certified that error appears in the above-indentified patent and that said Letters Patent is hereby corrected as shown below:

Column 12, line 4, change 111111001010 to --111111001010--.

Column 12, line 11, change 111111001010 to --111111001010--.

Column 17,
In Claim 1, line 23, change "w-bits" to --w-bit--.

Column 17,
In Claim 1, line 34, change "said" to --that--.

Column 17,
In Claim 2, change "2*n*1" to --$2^n-1$--.

Column 17,
In Claim 2, line 42, change "2n" to --$2^n$--.

Column 18,
In Claim 11, line, 22, change "claim 7" to --claim 1--.

UNITED STATES PATENT AND TRADEMARK OFFICE
CERTIFICATE OF CORRECTION

PATENT NO. : 5,446,683
DATED : August 29, 1995
INVENTOR(S) : Sean F. Mullen and Jonathan Jedwab It is certified that error appears in the above-indentified patent and that said Letters Patent is hereby corrected as shown below:

Column 18,
In Claim 11, line 27, change "means," to --means.--; and delete "and said signal representative of the operational state of said output stage is taken from the switch means in said output stage."

Column 18,
In Claim 12, change "claim 1" to --claim 7--.

Column 18,
In Claim 12, lines 27 - 29, change "means." to --means,--; and add "and said signal representative of the operational state of said output stage is taken from the switch means in said output stage."

Column 18,
In Claim 14, line 59, change "$2n$" to --$2^n$--.

Signed and Sealed this

Fourteenth Day of January, 1997

Attest:

BRUCE LEHMAN

Attesting Officer     Commissioner of Patents and Trademarks